United States Patent  
Lee et al.

(10) Patent No.: US 9,245,613 B2  
(45) Date of Patent: Jan. 26, 2016

(54) STORAGE INTERFACE APPARATUS FOR SOLID STATE DRIVE TESTER

(71) Applicant: UNITEST INC, Yongin-si, Gyeonggi-do (KR)

(72) Inventors: Eui Won Lee, Seongnam-si (KR); Hyo Jin Oh, Yongin-si (KR)

(73) Assignee: UNITEST INC, Yongin-si, Gyeonggi-do (KR)

( * ) Notice: Subject to any disclaimer, the term of this patent is extended or adjusted under 35 U.S.C. 154(b) by 265 days.

(21) Appl. No.: 13/921,829

(22) Filed: Jun. 19, 2013

(65) Prior Publication Data

US 2014/0047288 A1  Feb. 13, 2014

(30) Foreign Application Priority Data

Aug. 13, 2012  (KR) .................. 10-2012-0088324

(51) Int. Cl.
G11C 11/4093 (2006.01)
G11C 29/10 (2006.01)
G06F 11/22 (2006.01)

(52) U.S. Cl.
CPC ........ *G11C 11/4093* (2013.01); *G06F 11/2221* (2013.01); *G11C 29/10* (2013.01)

(58) Field of Classification Search
CPC .............. G11C 2029/5602; G11C 2029/5606; G11C 11/4093
USPC ......................................................... 714/719
See application file for complete search history.

(56) References Cited

U.S. PATENT DOCUMENTS

| 5,951,705 | A * | 9/1999 | Arkin et al. ................... 714/738 |
| 6,449,741 | B1 * | 9/2002 | Organ et al. ................... 714/724 |
| 6,634,005 | B1 * | 10/2003 | Lindsay et al. ............... 714/726 |
| 6,763,490 | B1 * | 7/2004 | Krech et al. ................... 714/738 |
| 7,071,679 | B1 * | 7/2006 | Sabih et al. ................. 324/750.3 |
| 7,392,446 | B1 * | 6/2008 | Simmons et al. ............. 714/725 |
| 7,420,384 | B1 * | 9/2008 | Sabih et al. ................. 324/750.3 |
| 7,734,966 | B1 * | 6/2010 | Lee et al. ....................... 714/718 |
| 8,001,434 | B1 * | 8/2011 | Lee et al. ....................... 714/733 |
| 8,467,735 | B2 * | 6/2013 | Giles et al. ................. 455/67.11 |
| 8,743,735 | B1 * | 6/2014 | Bershteyn et al. ............ 370/254 |
| 2003/0110427 | A1 * | 6/2003 | Rajsuman et al. ............ 714/724 |
| 2003/0233208 | A1 * | 12/2003 | Uesaka et al. ................ 702/118 |
| 2006/0123296 | A1 * | 6/2006 | Reichert ....................... 714/731 |
| 2006/0156137 | A1 * | 7/2006 | Raul et al. ..................... 714/738 |
| 2006/0161764 | A1 | 7/2006 | Alexander et al. |
| 2007/0245199 | A1 * | 10/2007 | Pochowski ................... 714/742 |

(Continued)

FOREIGN PATENT DOCUMENTS

KR  10-2010-0114697 A   10/2010

*Primary Examiner* — Joseph D Torres  
(74) *Attorney, Agent, or Firm* — Novick, Kim & Lee, PLLC; Jae Youn Kim

(57) ABSTRACT

Disclosed is a storage interface apparatus for a solid state drive (SSD) tester which allows a plurality of interfaces to share a single protocol in parts where the protocol is commonly used in a multiple interface for interfacing a storage. The storage interface apparatus for the solid state driver tester includes: a host terminal for receiving a test condition for testing a storage from a user; and a test control unit for generating a test pattern corresponding to the test condition to test the storage. The test control unit includes a storage interface unit for interfacing the storage, and the storage interface unit includes a plurality of interfaces that share a protocol in parts where the protocol is commonly used.

5 Claims, 4 Drawing Sheets

(56) References Cited

U.S. PATENT DOCUMENTS

2009/0003361 A1* 1/2009 Bakthavathsalam .......... 370/401
2009/0183045 A1* 7/2009 Yao et al. ..................... 714/738
2013/0193993 A1* 8/2013 Golov et al. ............. 324/750.01
2014/0047287 A1* 2/2014 Lee et al. ...................... 714/719
2014/0047289 A1* 2/2014 Lee .............................. 714/719

* cited by examiner

STORAGE INTERFACE APPARATUS FOR SOLID STATE DRIVE TESTER

BACKGROUND OF THE INVENTION

1. Field of the Invention

The present invention relates to a storage interface apparatus for a solid state drive tester, and more particularly to a storage interface apparatus for a solid state drive tester which allows a plurality of interfaces to share a single protocol in parts where the protocol is commonly used to interface storages.

2. Description of the Related Art

Until now, hard disk drives (HDDs) have been most generally known and used as large capacity digital media storage devices. However, in recent years, as prices of NAND flash semiconductor devices, which have the largest capacity among semiconductor devices having a memory function and data stored therein are not erased even when electric power is not supplied, are being lowered, large capacity digital medial storage apparatus such as solid state drives (SSDs) using a semiconductor having a memory function are newly appearing.

Writing and reading speeds of such an SSD are 3 to 5 times as fast as those of existing hard disks, and its performance of reading/writing an random address required by a database management system is several hundreds of times as excellent as those of existing hard disks. In addition, an SSD is operated in a silent way, so a noise problem of an existing hard disk can be solved. Further, since the SSD is operated with power consumption significantly lower than that of a hard disk, the SSD is known as to most suitable for a digital device, such as a laptop computer, which requires low power consumption.

In addition, the SSD has a higher durability against an external impact than an existing hard disk, and as the SSD can be manufactured to be smaller and more various in shape as compared with a hard disk having a fixed form in terms of an external design, an external shape of an electronic product employing the SSD can be made smaller, showing many excellent advantages in its applications.

Due to its advantages, it is expected that distributions of SSDs can be expanded rapidly to searches, home shopping, storage media of video service servers, storage media for storing various R&D materials, and special equipment, as well as existing desktop computers or laptop computers.

A performance of the above-described SSD is tested through an SSD tester, and an SSD test device for testing the SSD according to the related art is illustrated in FIG. 1.

An SSD test device according to the related art includes a host terminal 110, a network 120, a test control unit 130, a memory 140, and an external vector memory 160. In FIG. 1, reference numeral 200 denotes a storage unit 200 including a plurality of storages 201 to 200+N which are test targets.

The host terminal 110 functions to receive a test condition for testing a storage from a user, and the network 120 is in charge of a data interface between the host terminal 110 and the test control unit 130.

A program for testing an SSD is stored in the memory 140, and the external vector memory 160 functions to store pattern data for generating a desired test pattern.

The test control unit 130 functions to generate a test pattern corresponding to the test condition input by the user, adaptively select an interface according to a type of an interface of the storage to be tested to test the storage using the test pattern, and store failure data generated during the test in an internal memory.

Preferably, a plurality of devices installed in the test control unit 130 to test the SSD are implemented as one chip by using a field programmable gate array (FPGA).

The test control unit 130 includes a communication interface unit 131 connected to the host terminal 110 through the network 120 to receive information of the user and to transmit the test result to the host terminal 110, a storage interface unit 132 for interfacing the storage unit 200, and an embedded processor 133 for generating a test pattern corresponding to the test condition input by the user, controlling selection of an interface by the storage interface unit 132 according to an interface type of a storage to be tested, controlling a test of the storage unit 200 through the storage interface unit 132 based on the test pattern, and receiving the result.

The test control unit 130 includes a vector memory 134 for storing expectation data corresponding to the test pattern generated by the embedded processor 133, a failure processor 135 for comparing the expectation data stored in the vector memory 134 with the test result data acquired from the embedded processor 133 to determine a failure, and processing failure information generated in the case of a failure, and a failure memory 136 for storing the failure information generated in the failure processor 135.

Meanwhile, the storage interface unit 132 includes a plurality of multi-interfaces 151 to 151+N.

Here, internal configurations and operations of the plurality of multi-interfaces 151 to 151+N are the same, and thus only one multi-interface 151 will be described below for convenience' sake.

As illustrated in FIG. 2, the multi-interface 151 includes an advanced host controller interface (AHCI) 151a for interfacing instruction data generated in the embedded processor 133, a direct memory access (DMA) unit 151b for interfacing writing data generated in the embedded processor 133, a serial-ATA (SATA) interface 151c for supporting an SATA interface between the advanced host controller interface 151a and the storage 201 and between the direct memory access unit 151b and the storage 201, a serial attached SCSI (SAS) interface 151d for supporting an SAS interface between the advanced host controller interface 151a and the storage 201 and between the direct memory access unit 151b and the storage 201, a PCI express (PCIe) interface 151e for supporting a PCIe interface between the advanced host controller interface 151a and the storage 201 and between the direct memory access unit 151b and the storage 201, and a multiplexer (MUX) 151f for selecting one of the SATA interface 151c, the SAS interface 151d, and the PCIe interface 151e according to an interface selection signal generated in the embedded processor 133 to connect the storage 201 and the embedded processor 133.

Here, the SATA interface 151c, the SAS interface 151d, and the PCIe interface 151e are implemented therein with protocols for independent interfaces, that is, transport layers, transaction layers, link layers, and physical layers, respectively.

In the above-described solid state drive test device according to the related art, a plurality of test devices for testing storages are implemented as one chip by using an FPGA.

In more detail, after a user for testing an SSD connects a solid state drive tester to a storage to be tested, the user inputs a test condition through the host terminal 110. Here, the test condition may contain an interface selection signal for an interface with a storage to be tested.

The test condition of the user input through the host terminal 110 is transferred to the one-chipped test control unit 130 through the network 120.

The communication interface unit 131 of the test control unit 130 receives the test condition input by the user through the network 120, and transfers the received test condition to the embedded processor 133. If the test condition is input by the user and a test is requested, the embedded processor 133 extracts a test program for the storage test from a memory 140 and starts to test the storage. Here, as an initial operation of the test, test pattern data corresponding to the test condition input by the user are extracted from the external vector memory 160 to generate a test pattern.

The generated test pattern is input to the vector memory 134 as expectation data and is transferred to the multi-interface 151 at the same time, and then an interface selection signal is provided to the multi-interface 151 to select an interface corresponding to the storage 201.

For example, an interface selection signal is applied from the embedded processor 133 to the multiplexer 151*f* of the multi-interface 151, the multiplexer 151*f* selects one of the interfaces SATA, SAS, and PCIe according to the applied interface selection signal. That is, an interface corresponding to the interface of the storage 201 is selected.

Thereafter, instruction data output from the embedded processor 133 for the test are input to the SATA interface 151*c*, the SAS interface 151*d*, and the PCIe interface 151*e* through the advanced host controller interface 151*a*, respectively.

In addition, writing data output from the embedded processor 133 are input to the SATA interface 151*c*, the SAS interface 151*d*, and the PCIe interface 151*e*, respectively, through the DMA unit 151*b*.

In a state where the instruction data and the writing data output from the embedded processor 133 are input to the respective interfaces in this way, the multiplexer 151*f* selects only one interface according to an interface selection signal. The test of the storage 201 is started by transferring the instruction data and writing data input to the selected interface to the storage 201. For example, when the interface of the storage 201 uses the SATA interface, the SATA interface 151*c* is selected, and the instruction data and writing data input to the SATA interface 151*c* are converted into a format suitable for the SATA interface to be applied to the storage 201.

Here, standard interfaces are employed for the SATA interface, the SAS interface, and the PCIe interface, and protocols for interfaces, that is, protocols for transport layers, link layers, and physical layers are individually implemented in the interfaces, respectively.

Next, after result data for testing the storage 201 are read out according to a reading instruction, they are transferred to the embedded processor 133 through the multiplexer 151*f*, the SATA interface 151*c*, and the DMA unit 151*b* of the multi-interface 151.

If the data obtained by reading out the storage test are transferred to the embedded processor 133, the embedded processor 133 transmits the readout data to the failure processor 135.

The failure processor 135 compares expectation data read out from the vector memory 134 with the readout data (reading data) transferred from the embedded processor 133, and does not generate a failure signal if they are the same and generates a failure signal if they are different.

According to the failure signal generated in this way, the failure memory 136 stores the expectation data and the readout data input to the failure processor 135 as failure information while taking the transferred address as a logical block address (LBA).

In addition, the failure information stored in the failure memory 136 is transferred to the embedded processor 133 according to a request of the embedded processor 133, and is transmitted to the host terminal 110 through the communication interface unit 131 and the network 120.

Thus, the user can recognize the test result of the storage easily tested through the host terminal 110.

However, according to the related art, since interface units are independently manufactured for respective interfaces such as SATA, SAS, and PCIe to be output through the multiplexer, the number of gate counts increases, much heat and noise are generated due to the large sizes of the interfaces, and high implementation costs are required, causing problems in creating a plurality of channels.

For example, according to the related art, protocols are independently provided for respective interfaces, that is, protocols such as transport layers, link layers, and physical layers are provided for respective interfaces, making the size of the interface unit large.

SUMMARY OF THE INVENTION

Accordingly, the present invention has been made keeping in mind the above problems occurring in the prior art, and an object of the present invention is to provide a storage interface apparatus for a solid state drive tester which allows a plurality of interfaces to share a single protocol in parts where the protocol is commonly used to interface storages.

It is another object of the present invention to provide a storage interface apparatus for a solid state drive tester which allows a plurality of interfaces to share a single protocol in parts where the protocol is commonly used to interface storages to reduce the number of gate counts and a size of the interface apparatus.

It is still another object of the present invention to provide a storage interface apparatus for a solid state drive tester which allows a plurality of interfaces to share a single protocol in parts where the protocol is commonly used to reduce a size of the interface apparatus, thereby minimizing heat, noise, and costs and allowing a plurality of channels to be produced.

According to an aspect of the present invention, there is provided a storage interface apparatus for a solid state driver tester including: a host terminal for receiving a test condition for testing a storage from a user; and a test control unit for generating a test pattern corresponding to the test condition to test the storage, wherein the test control unit includes a storage interface unit for interfacing the storage, and the storage interface unit includes a plurality of interfaces, and the interfaces share a protocol in parts where the protocol is commonly used.

The storage interface unit may include a plurality of complex interfaces to simultaneously test the storages.

Each of the complex interfaces may include an SATA interface, an SAS interface, and a PCIe interface, and the SATA interface, the SAS interface, and the PCIe interface may share a link layer protocol.

Each of the complex interfaces may include an SATA interface, an SAS interface, and a PCIe interface, and the SATA interface, the SAS interface, and the PCIe interface may share a physical layer protocol.

Each of the complex interfaces may include an SATA interface, an SAS interface, and a PCIe interface, and transport layers of the SATA interface, the SAS interface, and the PCIe interface may be independently configured from each other, respectively.

Each of the complex interfaces may include an advanced host controller interface (AHCI) for interfacing instruction data generated by the embedded processor; a direct memory access (DMA) unit for interfacing writing data generated by the embedded processor; a serial-ATA (SATA) transport layer in charge of a transport layer protocol of an SATA interface between the advanced host controller interface and the storage and between the direct memory access unit and the storage; a serial attached SCSI (SAS) transport layer in charge of a transport layer protocol of an SAS interface between the advanced host controller interface and the storage and between the direct memory access unit and the storage; a PCI express (PCIe) transaction layer in charge of a transaction layer protocol of a PCIe interface between the advanced host controller interface and the storage and between the direct memory access unit and the storage; an SAS port layer for performing a data interface between the SAS transport layer and a link layer; a sharing link layer for allowing the SATA transport layer, the SAS port layer, and the PCIe transaction layer to share a link layer protocol; and a physical layer for performing a physical layer interface between the sharing link layer and the storage.

According to the present invention, the storage interface apparatus for the solid state drive tester can allows a plurality of interfaces to share a single protocol in parts where the protocol is commonly used to interface storages to reduce the number of gate counts and a size of the interface apparatus.

According to the present invention, the storage interface apparatus for the solid state drive tester can allow a plurality of interfaces to share a single protocol in parts where the protocol is commonly used to reduce a size of the interface apparatus, thereby minimizing heat, noise, and costs and allowing a plurality of channels to be produced.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, an exemplary embodiment of the present invention will be described in detail with reference to the accompanying drawings. A detailed description of known functions and configurations of the present invention will be omitted when it may make the subject of the present invention unclear.

Figure 3:
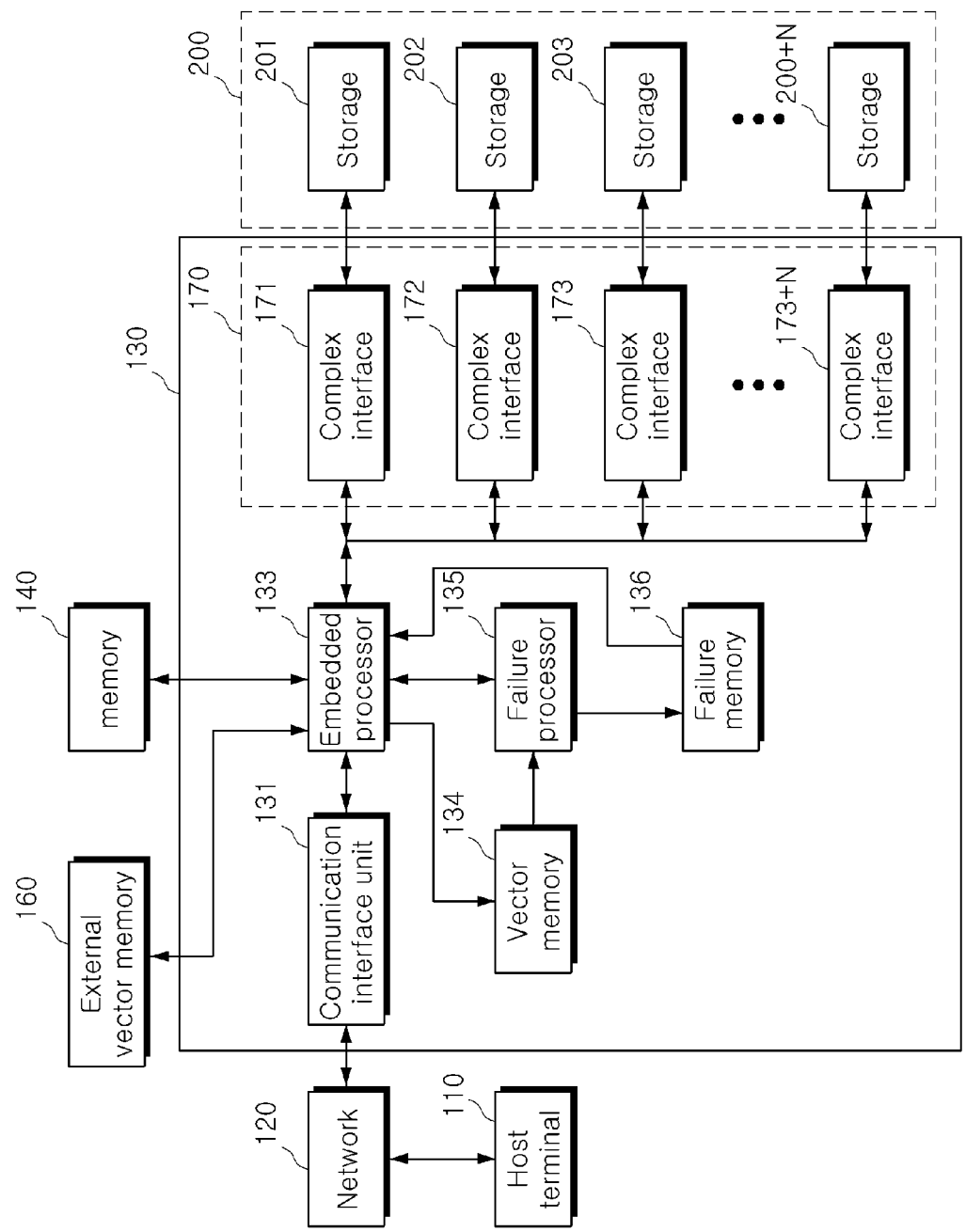
FIG. 3 is a block diagram of a storage interface apparatus for a solid state drive tester according to the present invention.

FIG. 3 is a diagram of a storage interface apparatus for a solid state driver tester. The storage interface apparatus includes a host terminal 110, a network 120, a test control unit 130, a memory 140, and an external vector memory 160. In FIG. 3, reference numeral 200 denotes a storage unit 200 including a plurality of storages 201 to 200+N which are test targets.

Figure 1:
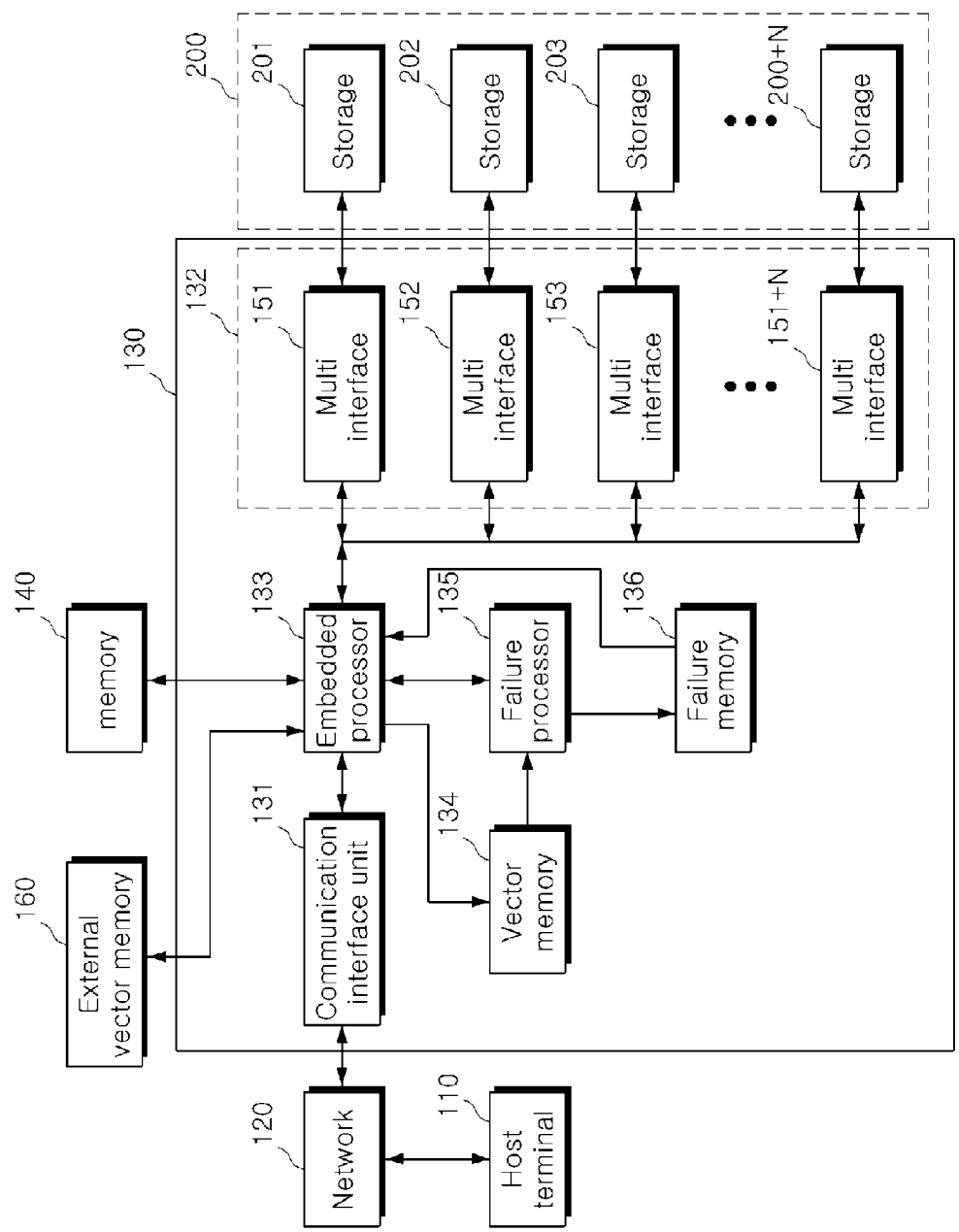
FIG. 1 is a schematic block diagram of a solid state drive test device according to the related art.
Figure 2:
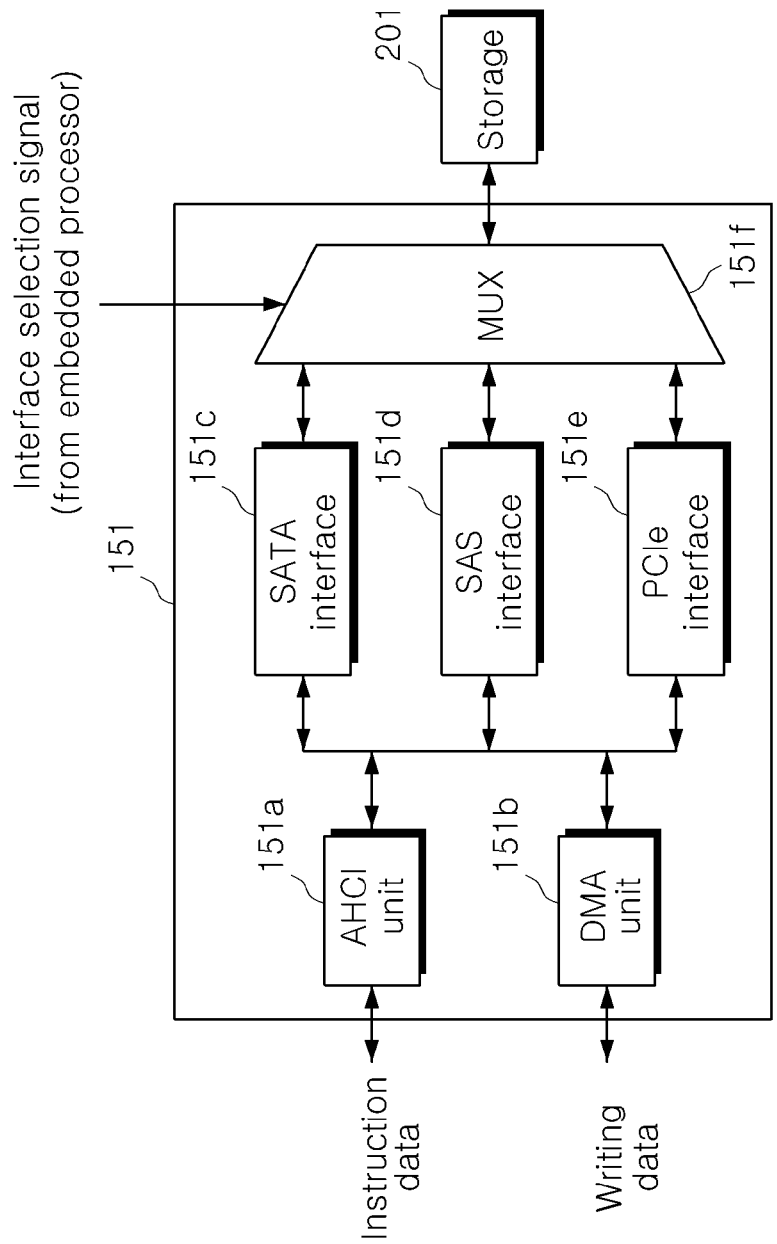
FIG. 2 is a block diagram of an embodiment of a storage interface unit of FIG. 1.

All the configurations and operations of the test control unit 130 of FIG. 3 except for the storage interface unit 170 are the same as those of FIG. 1 described in the description of the related art. However, the storage interface units are different, and thus the reference numerals of the test control unit of FIG. 1 and the test control unit of FIG. 3 need to be different but the same reference numeral as that of the test control unit 130 of FIG. 1 is given to the test control unit 130 of the present invention for convenience' sake.

The host terminal 110 functions to receive a test condition for testing a storage from the user, and the network 120 is in charge of a data interface between the host terminal 110 and the test control unit 130.

A program for testing an SSD is stored in the memory 140, and the external vector memory 160 functions to store pattern data for creating a desired test pattern.

The test control unit 130 functions to generate a test pattern corresponding to the test condition input by the user, transfer the test pattern to the storage through the same interface as that of the storage to be tested to test the storage, and store failure data generated during the test.

Preferably, a plurality of devices installed in the test control unit 130 to test the SSD are implemented as one chip by using a field programmable gate array (FPGA).

The test control unit 130 includes a communication interface unit 131 connected to the host terminal 110 through the network 120 to receive information of the user and to transmit the test result to the host terminal 110, a storage interface unit 170 for interfacing the storage unit 200, and an embedded processor 133 for generating a test pattern corresponding to the test condition input by the user, controlling selection of an interface by the storage interface unit 170 according to an interface type of a storage to be tested, controlling a test of the storage unit 200 through the storage interface unit 170 based on the test pattern, and receiving the result.

The test control unit 130 includes a vector memory 134 for storing expectation data corresponding to the test pattern created by the embedded processor 133, a failure processor 135 for comparing the expectation data stored in the vector memory 134 with the test result data acquired from the embedded processor 133 to determine a failure, and processing failure information generated in the case of a failure, and a failure memory 136 for storing the failure information generated in the failure processor 135.

Meanwhile, the storage interface unit 170 includes a plurality of complex interfaces 171 to 171+N.

Here, internal configurations and operations of the plurality of complex interfaces 171 to 171+N are the same, and thus only one complex interface 171 will be described below for convenience' sake.

Figure 4:
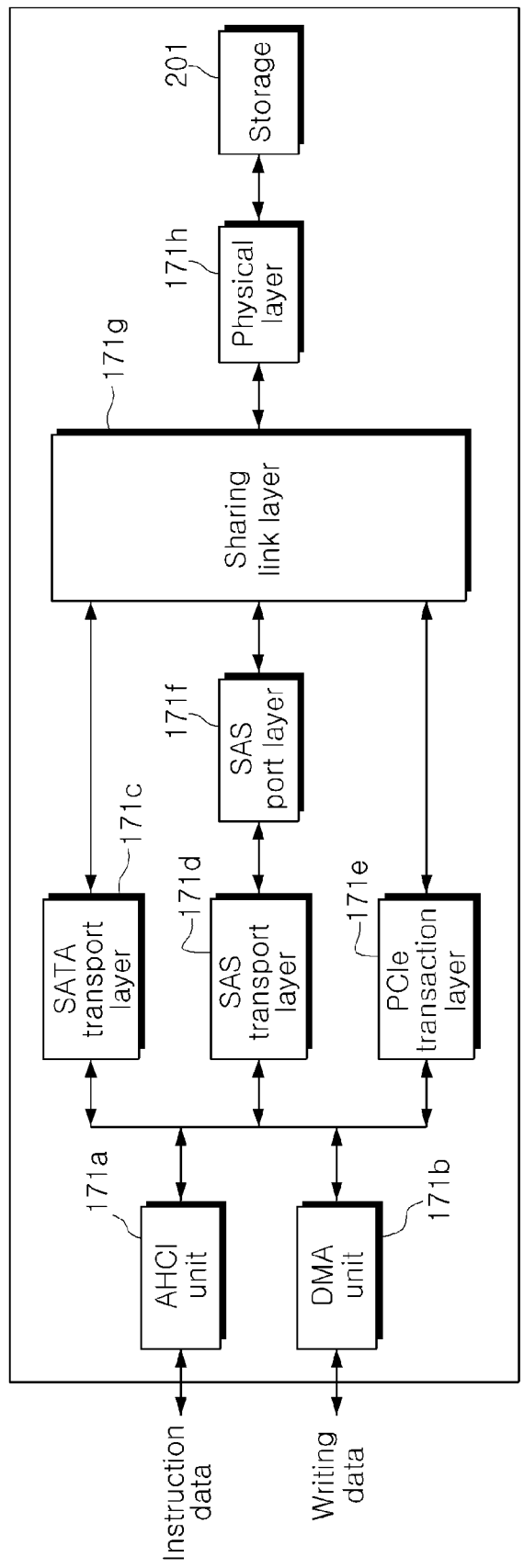
FIG. 4 is a block diagram of an embodiment of a storage interface unit of FIG. 3.

As illustrated in FIG. 4, the complex interface 171 includes an advanced host controller interface (AHCI) 171a for interfacing instruction data generated in the embedded processor 133, a direct memory access (DMA) unit 171b for interfacing writing data generated in the embedded processor 133, a serial-ATA (SATA) transport layer 171c in charge of a transport layer protocol of an SATA interface between the advanced host controller interface 171 and the storage 201 and between the direct memory access unit 171b and the storage 201, a serial attached SCSI (SAS) transport layer 171d in charge of a transport layer protocol of an SAS interface between the advanced host controller interface 171 and the storage 201 and the direct memory access unit 171b and the storage 201, a PCI express (PCIe) transaction layer 171e in charge of a transaction layer protocol of a PCIe interface between the advanced host controller interface 171 and the storage 201 and the direct memory access unit 171b and the storage 201, an SAS port layer 171f for a data interface between the SAS transport layer and the link layer, a sharing link layer 171g for allowing the SATA transport layer 171c, the SAS port layer 171f, and the PCIe transaction layer 171e to share the link layer protocol, and a physical layer 171h for performing a physical layer interface between the sharing link layer 171g and the storage 201.

In the storage interface apparatus for a solid state drive tester according to the present invention, a plurality of test devices for testing a storage are implemented as one chip on one board by using FPGA. In addition, the SATA interface, the SAS interface, and the PCIe interface are realized for the storage interface such that the same protocol realized in the interfaces is mutually shared, and the protocols which are not mutually shared are realized independently, whereby a size of the interface can be reduced by simplifying an entire structure of interface, making it possible to reduce an entire size of the solid state drive tester.

In more detail, the user for testing an SSD connects the solid state drive tester to the storage to be tested, and then a test condition is input through the host terminal 110. Here, the test condition may include a test condition for generating a test pattern.

The test condition input by the user through the host terminal 110 is transferred to the one-chipped test control unit 130 through the network 120.

The communication interface unit 131 of the test control unit 130 receives a test condition input by the user through the network 120, and transfers the received test condition to the embedded processor 133. If a test condition is input by the user and a test is requested, the embedded processor 133 extracts a text program for testing a storage from the memory 140 to start the test of the storage. Here, as an initial operation of the test, test pattern data corresponding to the test condition input by the user are extracted to the external vector memory 160 to generate a test pattern.

The test pattern generated in this way is input to the vector memory 134 as expectation data and is transferred to the complex interface 171 at the same time, and then instruction data and writing data are input to the complex interface 171, respectively.

As illustrated in FIG. 4, in the complex interface 171, the instruction data output from the embedded processor 133 for a test are input to the SATA transport layer 171c, the SAS transport layer 171d, and the PCIe transaction layer 171e, respectively, through the advanced host controller interface 171a.

In addition, the writing data output from the embedded processor 133 are input to the SATA transport layer 171c, the SAS transport layer 171d, and the PCIe transaction layer 171e, respectively, through the direct memory access (DMA) unit 171b.

If the instruction data and writing data output from the embedded processor 133 in this way are input to the respective transport layers and transaction layers, the instruction data and writing data are processed with the corresponding layer protocol in the corresponding layer only in the case corresponding to its interface. For example, when the input instruction data and writing data take forms suitable for the SATA interface, the SATA transport layer 171c processes the instruction data and writing data with the corresponding protocol and transfers the processed instruction data and writing data to the sharing link layer 171g. In addition, when the input instruction data and writing data take forms suitable for the SAS interface, the SAS transport layer 171d processes instruction data and writing data with the corresponding protocol, and the data processed in this way are transferred to the sharing link layer 171g via the SAS port layer 171f. Further, when the input instruction data and writing data take forms suitable for the PCIe interface, the PCIe transaction layer 171e processes the instruction data and writing data with the corresponding protocol and transfers the processed instruction data and writing data to the sharing link layer 171g.

The sharing link layer 171g processes instruction data and writing data transferred from the SATA transport layer 171c, the SAS transport layer 171d, or the PCIe transaction layer 171e by using a single link protocol, and transfers the processed instruction data and writing data to the physical layer 171h.

The physical layer 171h converts the input instruction data and writing data to a physical signal suitable for the storage 201, and transfers the physical signal to the storage 201.

For example, according to the interface method of the related art, storages and interfaces are implemented by realizing a transport layer, a link layer, and a physical layer in a separate SATA interface unit for an SATA interface, realizing a transport layer, a port layer, a link layer, and a physical layer in a separate SAS interface unit for an SAS interface, and realizing a transport layer, a link layer, and a physical layer in a separate PCIe interface unit for a PCIe interface. In this case, as protocols are realized in respective interfaces, a size of an entire interface apparatus becomes larger, and, as a large number of devices are realized separately, much heat is generated and the number of gate counts increases.

In order to solve the above problem, the present invention realizes a plurality of complex interfaces, and is designed such that protocols realized in respective interfaces in the same way, that is, protocols on the link layer and the physical layer are shared mutually, and only protocols which are not shared by the interfaces are realized separately, whereby a size of the entire interface apparatus can be reduced and the number of gate counts is reduced through reduction of the interface apparatus, making it possible to reduce heat and noise.

Next, after read out according to a reading instruction, the result data for testing the storage 201 are received through the physical layer 171h of the complex interface 171 and transferred to the sharing link layer 171g.

After processing the reading data transferred from the physical layer 171h, the sharing link layer 171g transfers the reading data to the SATA transport layer 171c, the SAS transport layer 171d, and the PCIe transaction layer 171e, respectively.

Thereafter, the SATA transport layer 171c, the SAS transport layer 171d, and the PCIe transaction layer 171e are operated to interface the reading data only when the input reading data take an interface form corresponding to an interface thereof. For example, when an interface manner of the storage 201 is an SATA interface manner, only is the SATA transport layer 171c operated to transfer the reading data to the AHCI unit 171a and the DMA unit 171b. Further, when the interface manner of the storage 201 is an SAS interface manner, only is the SAS transport layer 171d operated to transfer the reading data to the AHCI unit 171 and the DMA unit 171b. In addition, when the interface manner of the storage 201 is a PCIe interface manner, only is the PCIe transaction layer 171e operated to transfer the reading data to the AHCI unit 171a and the DMA unit 171b.

The storage response data and reading data output through the AHCI unit 171a and the DMA unit 171b are transferred to the embedded processor 133.

If the data (reading data) obtained by reading out the storage test is transferred to the embedded processor 133 in this way, the embedded processor 133 transmits the transferred readout data to the failure processor 135.

The failure processor 135 compares the expectation data read out from the vector memory 134 with the readout data (reading data) transferred from the embedded processor 133, and if the expectation data and the readout data are the same, there is no output, and otherwise, a failure signal is generated.

The failure memory 136 stores expectation data and readout data input to the failure processor 135 as failure information while taking the transferred address as a logical block address (LBA) according to the generated failure signal.

Further, the failure information stored in the failure memory 136 is transferred to the embedded processor 133 upon the request of the embedded processor 133, and is transmitted to the host terminal 110 through the communication interface unit 131 and the network 120.

Thus, the user can easily recognize the test result of the storage tested through the host terminal 110.

The present invention is not limited to the above-described embodiment, and may be variously modified by those skilled in the art to which the present invention pertains without departing from the spirit of the present invention and the modification falls within the scope of the present invention.

What is claimed is:

1. A storage interface apparatus for a solid state driver tester, the storage interface apparatus comprising:
    a host terminal for receiving a test condition for testing a storage from a user; and
    a test control unit for generating a test pattern corresponding to the test condition to test the storage,
    wherein the test control unit includes a storage interface unit for interfacing the storage, the storage interface unit includes a plurality of interfaces, and the interfaces share a protocol where the protocol is commonly used,
    wherein the storage interface unit includes a plurality of complex interfaces to simultaneously test a plurality of storages, and
    wherein each of the complex interfaces includes a serial-ATA (SATA) interface, a serial attached SCSI (SAS) interface, and a PCI express (PCIe) interface, and the SATA interface, the SAS interface, and the PCIe interface share a link layer protocol.

2. A storage interface apparatus for a solid state driver tester, the storage interface apparatus comprising:
    a host terminal for receiving a test condition for testing a storage from a user; and
    a test control unit for generating a test pattern corresponding to the test condition to test the storage,
    wherein the test control unit includes a storage interface unit for interfacing the storage, the storage interface unit includes a plurality of interfaces, and the interfaces share a protocol where the protocol is commonly used,
    wherein the storage interface unit includes a plurality of complex interfaces to simultaneously test a plurality of storages, and
    wherein each of the complex interfaces includes a serial-ATA (SATA) interface, a serial attached SCSI (SAS) interface, and a PCI express (PCIe) interface, and the SATA interface, the SAS interface, and the PCIe interface share a physical layer protocol.

3. The storage interface apparatus of claim 1, wherein the SAS interface, and the PCIe interface are independently configured from each other, respectively.

4. A storage interface apparatus for a solid state driver tester, the storage interface apparatus comprising:
    a host terminal for receiving a test condition for testing a storage from a user; and
    a test control unit for generating a test pattern corresponding to the test condition to test the storage,
    wherein the test control unit includes a storage interface unit for interfacing the storage, the storage interface unit includes a plurality of interfaces, and the interfaces share a protocol where the protocol is commonly used,
    wherein the storage interface unit includes a plurality of complex interfaces to simultaneously test a plurality of storages, and
    wherein each of the complex interfaces includes:
    an advanced host controller interface (AHCI) for interfacing instruction data generated by the embedded processor;
    a direct memory access (DMA) unit for interfacing writing data generated by the embedded processor;
    a serial-ATA (SATA) transport layer in charge of a transport layer protocol of a SATA interface between the advanced host controller interface and the storage and between the direct memory access unit and the storage;
    a serial attached SCSI (SAS) transport layer in charge of a transport layer protocol of a SAS interface between the advanced host controller interface and the storage and between the direct memory access unit and the storage;
    a PCI express (PCIe) transaction layer in charge of a transaction layer protocol of a PCIe interface between the advanced host controller interface and the storage and between the direct memory access unit and the storage;
    a SAS port layer for performing a data interface between the SAS transport layer and a link layer; and
    a sharing link layer for allowing the SATA transport layer, the SAS port layer, and the PCIe transaction layer to share a link layer protocol.

5. The storage interface apparatus of claim 4, wherein each of the complex interfaces further includes a physical layer for performing a physical layer interface between the sharing link layer and the storage.

* * * * *